(12) United States Patent
De Souza et al.

(10) Patent No.: US 10,354,880 B2
(45) Date of Patent: Jul. 16, 2019

(54) SIDEWALL SPACER WITH CONTROLLED GEOMETRY

(71) Applicant: International Business Machines Corporation, Armonk, NY (US)

(72) Inventors: Joel P. De Souza, Putnam Valley, NY (US); Yun Seog Lee, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/480,232

(22) Filed: Apr. 5, 2017

(65) Prior Publication Data

US 2018/0294159 A1  Oct. 11, 2018

(51) Int. Cl.
| | | |
|---|---|---|
| *H01L 21/28* | (2006.01) | |
| *H01L 21/3065* | (2006.01) | |
| *H01L 21/311* | (2006.01) | |
| *H01L 21/04* | (2006.01) | |
| *H01L 21/3213* | (2006.01) | |
| *H01L 21/285* | (2006.01) | |

(52) U.S. Cl.
CPC .... *H01L 21/28123* (2013.01); *H01L 21/0475* (2013.01); *H01L 21/285* (2013.01); *H01L 21/28247* (2013.01); *H01L 21/3065* (2013.01); *H01L 21/311* (2013.01); *H01L 21/31105* (2013.01); *H01L 21/31116* (2013.01); *H01L 21/32136* (2013.01); *H01L 21/32139* (2013.01)

(58) Field of Classification Search
None
See application file for complete search history.

(56) References Cited

U.S. PATENT DOCUMENTS

| | | | | |
|---|---|---|---|---|
| 4,755,477 A | * | 7/1988 | Chao | H01L 21/76216 257/E21.557 |
| 6,417,084 B1 | * | 7/2002 | Singh | H01L 21/28114 257/E21.205 |
| 7,361,561 B2 | | 4/2008 | Goolsby et al. | |
| 7,402,875 B2 | | 7/2008 | Datta et al. | |

(Continued)

FOREIGN PATENT DOCUMENTS

EP   0164186 A1 * 12/1985   ......... H01L 21/0332

OTHER PUBLICATIONS

R. Cheng et al., "High-frequency self-aligned graphene transistors with transferred gate stacks," Proceedings of the National Academy of Sciences, vol. 109, No. 29, 2012, pp. 11588-11592.

*Primary Examiner* — Stephanie P Duclair
(74) *Attorney, Agent, or Firm* — Patterson + Sheridan, LLP

(57) ABSTRACT

Embodiments herein describe techniques for forming sidewalls on vertical structures on a semiconductor substrate. In one embodiment, the semiconductor substrate includes a first layer (e.g., a conductive layer such as an electrode) on which a second layer (e.g., an insulator) is disposed. An undercut etch is performed which selectively etches the sides of the material in the first layer but not the material in the second layer. A conformal deposition process is used to deposit the material of the sidewall into the undercut regions. Further etches can be performed to shape the sidewalls disposed on the sides of the material in the first layer.

18 Claims, 9 Drawing Sheets

(56) References Cited

U.S. PATENT DOCUMENTS

| | | | |
|---|---|---|---|
| 7,411,227 B2 * | 8/2008 | Amos | H01L 21/28052 |
| | | | 257/204 |
| 8,030,707 B2 | 10/2011 | Cheng et al. | |
| 8,673,725 B2 | 3/2014 | O'Meara et al. | |
| 8,993,445 B2 | 3/2015 | Choi et al. | |
| 9,111,746 B2 | 8/2015 | Ranjan et al. | |
| 2008/0085612 A1 * | 4/2008 | Smythe | H01L 21/02164 |
| | | | 438/787 |
| 2013/0089962 A1 | 4/2013 | Chang et al. | |
| 2014/0120681 A1 | 5/2014 | Chang et al. | |
| 2015/0137270 A1 | 5/2015 | Beyer et al. | |

\* cited by examiner

SIDEWALL SPACER WITH CONTROLLED GEOMETRY

BACKGROUND

The present invention relates to forming sidewalls on a semiconductor substrate.

Many semiconductor devices use sidewalls to isolate conductive materials from other portions of the integrated circuit. Specifically, the sidewalls can insulate the sides of vertical structures (e.g., electrodes) from the substrate and other neighboring components. Sidewalls are especially useful when fabricating transistors, e.g., fin field effect transistors (FET) and microelectromechanical systems (MEMS) which can have tall vertical structures.

SUMMARY

One embodiment described herein is a method that includes providing a first layer directly contacting a first side of a second layer and a substrate directly contacting a second side of the second layer where the first side is opposite the second side, and where a material in the first layer is different than a material in the second layer. The method includes selectively etching the material of the second layer to form an undercut region in the second layer, filling the undercut region with an oxide material using a conformal deposition process, and etching the oxide material to form at least one sidewall spacer in the second layer where the at least one sidewall spacer includes the undercut region.

Another embodiment described herein is method that includes providing a dielectric layer directly contacting a first side of a conductor and a substrate directly contacting a second side of the conductor where the first side is opposite the second side. The method includes selectively etching the conductor to form an undercut region, filling the undercut region with a first material using a conformal deposition process, and etching the first material to form at least one sidewall spacer contacting the conductor where the at least one sidewall spacer includes the undercut region.

Another embodiment described herein is method that includes providing a first layer directly contacting a first side of a second layer and a substrate directly contacting a second side of the second layer where the first side is opposite the second side, and where a material in the first layer is different than a material in the second layer. The method includes etching the material of the second layer, but not the material of the first layer, to form respective undercut regions on third and fourth sides of the material in the second layer, filling the respective undercut regions with an oxide material using a conformal deposition process, and etching the oxide material to form two sidewall spacers in the second layer where the two sidewall spacers include the respective undercut regions.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments herein describe techniques for forming sidewalls on vertical structures on a semiconductor substrate. In one embodiment, the semiconductor substrate includes a second layer (e.g., a conductive layer such as an electrode) on which a first layer (e.g., an insulator) is disposed. An undercut etch is performed which selectively etches the sides of the material in the second layer but not the material in the first layer. For example, by using a selective isotropic etch, the sides of the material in the bottom second layer are removed while the top first layer is unaffected thereby forming undercut regions.

A conformal deposition process is used to deposit the material of the sidewall into the undercut regions. In one embodiment, the conformal deposition continues until the entire volume of the undercut regions is filled. Further etches can be performed to shape the sidewalls disposed on the sides of the material in the second layer.

Figure 1:
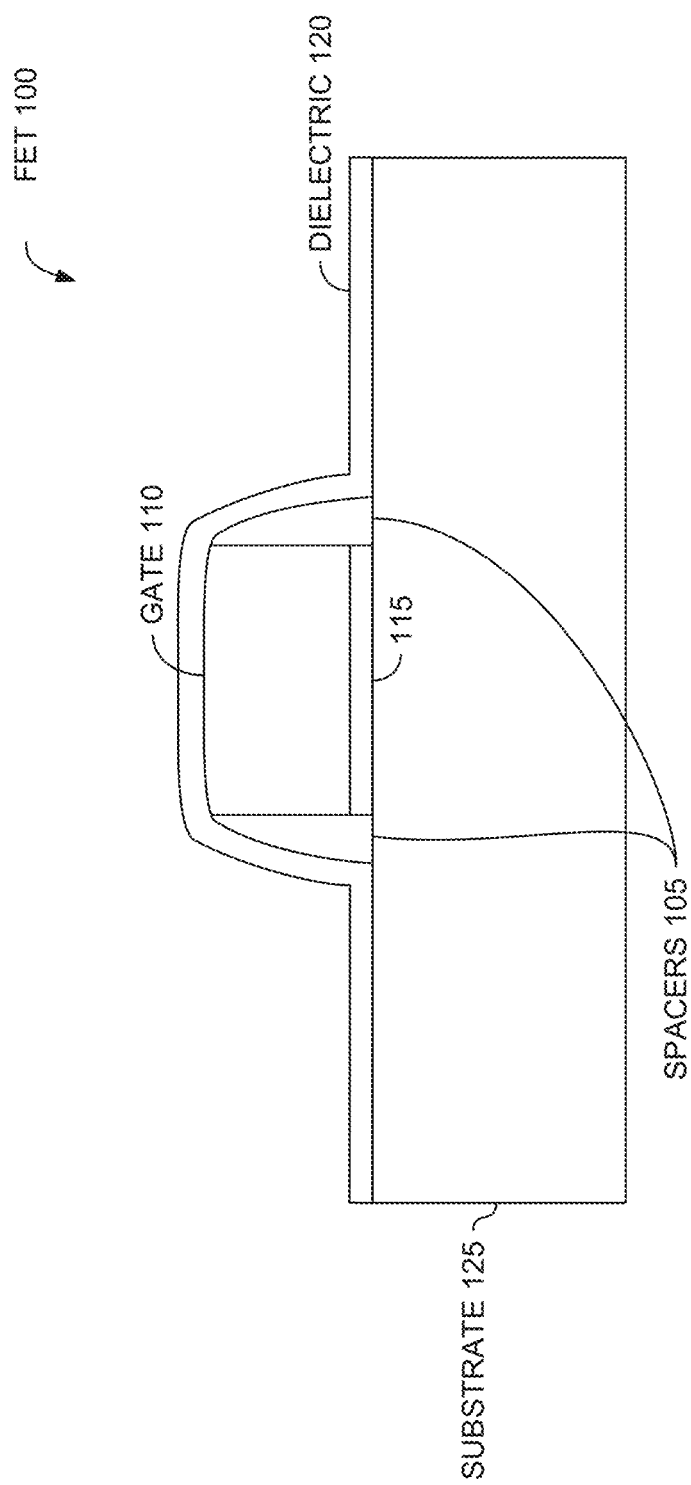
FIG. 1 illustrates a FET that includes a gate with sidewall spacers, according to one embodiment described herein.

FIG. 1 illustrates a portion of a FET 100 that includes a gate 110 with sidewall spacers 105, according to one embodiment described herein. In FIG. 1, the drain and source portions of the FET 100 are not shown.

The gate 110 may be made from silicide, polysilicon, metal (e.g., tungsten or molybdenum), or any other conductive material. The gate 110 is insulated from the substrate 125 by a thin dielectric 115 (e.g., a gate oxide). The substrate 125 may be a crystalline semiconductor such as crystalline silicon. The different portions of the substrate 125 may be doped differently—i.e., either n-type or p-type. For example, the portions of substrate 125 to the left and right of the gate 110 may have higher dopant concentrations than the portions of the substrate 125 directly underneath the gate 110.

A dielectric layer 120 is disposed over the gate 110, the spacers 105, and the substrate 125. The dielectric layer 120 may insulate the underlying structures from other layers that are deposited later—e.g., metal layers. However, the dielectric layer 120 is not a requirement.

The spacers 105 may be used to support the gate 110. Moreover, the spacers 105 can insulate the gate 110 for neighboring conductive materials. The use of the spacers 105 may permit the density of the FETs in the integrated circuit to increase. Although FIG. 1 illustrates using spacers 105 in a FET, the embodiments herein are not limited to such. Sidewall spacers 105 may be useful for other types of vertical structures disposed on semiconductor substrates. For example, vertical spacers 105 may be used to passive conductive material or to provide additional support or passivation for finFETs or electro/mechanical structures—e.g., MEMS.

Figure 2A:
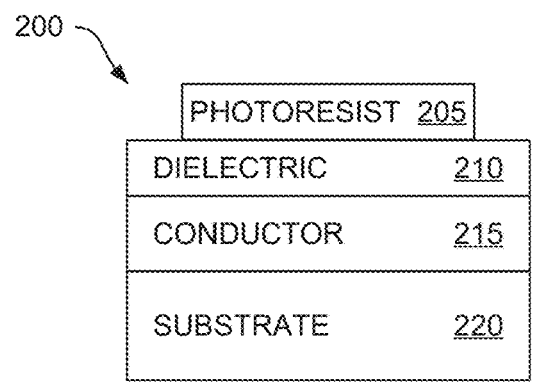
FIGS. 2A-2H illustrate forming sidewall spacers along the sides of a conductor, according to one embodiment described herein.

FIGS. 2A-2H illustrate forming sidewall spacers along the sides of a conductor, according to one embodiment described herein. FIG. 2A illustrates a stack 200 formed from a plurality of layers. The stack 200 includes photoresist 205 which is deposited and patterned on a dielectric layer 210. The dielectric layer 210 can include any type of insulative material. Some non-limiting examples include silicon dioxide ($SiO_2$), aluminum oxide ($Al_2O_3$), hafnium oxide ($HfO_2$), titanium oxide ($TiO_2$), and the like. The dielectric layer 210 is disposed on a conductor 215 which can be any conductive material—e.g., silicide, polysilicon, metal (e.g., tungsten), and the like. In one embodiment, the conductor 215 is an electrode that can be used in an electrical device. For example, the conductor 215 may be formed into the gate 110 shown in the FET 100 in FIG. 1.

The conductor 215 is disposed on a substrate 220 which, in one embodiment, is a crystalline semiconductor substrate. However, in another embodiment, the substrate 220 may include a dielectric layer or insulator that separates a crystalline semiconductor portion of the substrate 220 from the conductor 215. Put differently, the substrate 220 may include multiple layers that each includes different materials. Moreover, although FIGS. 2A-2H illustrate forming sidewall spacers on the layer that contains the conductor 215, the embodiments are not limited to such. That is, instead of forming sidewall spacers for the vertical conductor 215, the embodiment herein can be used to form sidewall spacers for any vertical structure (whether conductive, insulative, or semi-conductive).

Figure 2B:
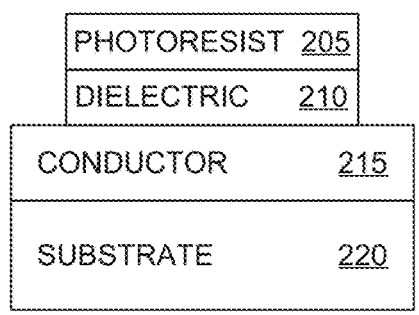

FIG. 2B illustrates etching the dielectric layer 210 into the same pattern formed by the photoresist 205. In one embodiment, the etching process performed at FIG. 2B is selective so that the material in the dielectric layer 210 is removed while the conductor 215 is unaffected—i.e., very little or none of the material of the conductor 215 is removed during the etch.

Figure 2C:
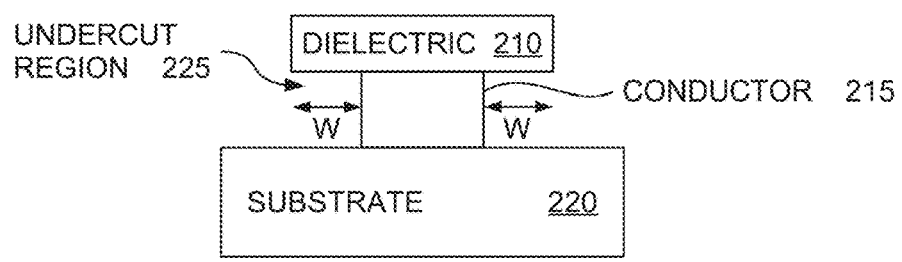

FIG. 2C illustrates performing an undercut etch which removes material at the sides of the conductor 210. In FIG. 2C, it is assumed that the photoresist shown in FIGS. 2A and 2B has already been removed. As shown, the undercut etch removes portions of the conductor 215 that are directly below the dielectric 210 to form undercut regions 225 on both sides of the conductor 215. In one embodiment, the process used to perform the undercut etch removes the material of the conductor 215 without removing the material of the dielectric layer 210, or at least removes the material of the conductor 215 at a faster rate than the material of dielectric layer 210.

In one embodiment, the process used to form the undercut regions 225 perform an isotropic etch. Isotropic etching can be either a wet etching or dry etching process used to remove material from the conductor 215. In one embodiment, the isotropic etch uses a chemical as an etchant substance. The etchant may be a corrosive liquid or a chemically active ionized gas such as plasma. Unlike anisotropic etching, isotropic etching does not etch in a single direction, but rather etches horizontally as well as vertically into the surface of the conductor 215. The horizontal etching results in undercutting the patterned dielectric layer 210 such that portions of the layer 210 hang over the undercut region 225.

One suitable technique for performing the isotropic etch is reactive ion etching (ME) which is a dry etching process that uses a gaseous chemical etchant in the present of plasma to remove the sides of the conductor 215. In one embodiment, the gas etchant is a sulfur containing gas such as $SF_6$. The RIE may be performed at low power or high power— e.g., between 1 W/inch$^2$ to 20 W/inch$^2$—in a vacuum chamber. In one embodiment, the gas etchant used when performing RIE does not include carbon which can make the isotropic etch more anisotropic (e.g., decrease the rate at which the RIE etches in the horizontal direction shown in FIG. 2C).

The undercut regions 225 have a width (W) which is controlled by the selected etching process. The undercut etching process determines the width of the undercut regions, which in turn determines the width of the sidewall spacers (which are described below). Thus, by controlling the etching process at FIG. 2C, the width of the sidewall spacers can be set. The width of the undercut region 225 can be set by controlling the timing of the etching process, power of the etching process, the pressure of the etching process, the rate at which the gas etchant is introduced into the chamber, and the like. In this manner, a designer can use the etching process to control the width of the undercut region 225 which then controls, at least in part, the width of the sidewall spacers.

Figure 2D:
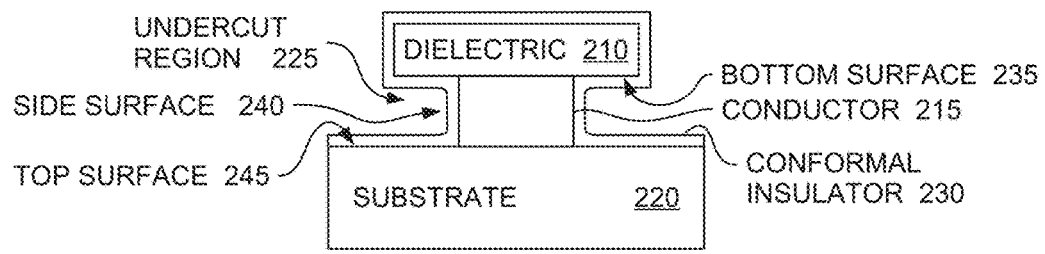

FIG. 2D illustrates depositing a conformal insulator 230 to form the sidewall spacers. The conformal insulator 230 can include any insulative material such as silicon dioxide ($SiO_2$), aluminum oxide ($AL_2O_3$), hafnium oxide ($HfO_2$), titanium oxide ($TiO_2$), nitrides, oxy-nitrides, and the like. In one embodiment, the material of the conformal insulator 230 is the same as the material of the dielectric layer 210. However, in another embodiment, the conformal insulator 230 is a different insulative material from the dielectric layer 210. Moreover, in other embodiments, a different material besides an insulative material can be disposed conformally in the undercut region 225.

As shown in FIG. 2D, the conformal insulator 230 is deposited on all exposed surfaces on the stack 200. For example, the conformal insulator 230 is disposed on a bottom surface 235 of the dielectric layer 210, a side surface 240 of the conductor 215, and a top surface 245 of the substrate 220. In one embodiment, the thickness of the conformal insulator 230 is the same regardless of the surface on which the insulator 230 is deposited.

In one embodiment, the conformal insulator 230 is deposited using atomic layer deposition (ALD). Although the details of the ALD process are described below, the ALD can use sequential deposition in the presence of gaseous precursors to form the conformal insulator 230. Thus, unlike other deposition techniques that are unable to effectively deposit material on all the surfaces in the undercut regions 225 (e.g., the bottom surface 235 and side surfaces 240), an ALD process can deposit the insulator 230 on these surfaces. Although ALD is specifically described, the embodiments herein can be used with any deposition process that can conformally deposit material suitable for a sidewall spacer into the undercut region 225.

Figure 2E:
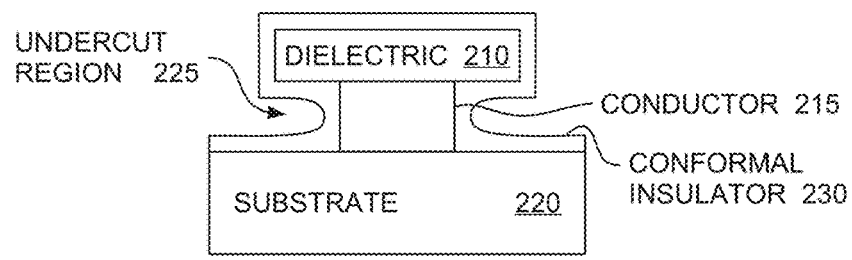

FIG. 2E illustrates continuing to form the conformal insulator 230 to fill the undercut regions 225. As shown in FIGS. 2D and 2E, in this embodiment the conformal insulator 230 is disposed on all three surfaces defining the undercut regions 225. Thus, as the conformal insulator 230 continues to be deposited, the thickness of the conformal insulator 230 increases from the bottom surface 235 of the dielectric 210 towards the substrate 220, from the side surface 240 in the horizontal direction, and from the top surface 245 of the substrate 220 towards the dielectric layer 210. The conformal insulator 230 may be deposited at the same rate on each of the surfaces in the undercut regions 225.

In one embodiment, FIGS. 2D and 2E illustrate the continued deposition of the conformal insulator 230 during the same deposition process—e.g., the same ALD process. As the process continues, the process conformally deposits the insulator 230 to increase its thickness. Comparing FIGS. 2D and 2E illustrate that a continuous deposition process can form or grow the conformal insulator 230 on the surfaces in the undercut region 225 at a same or similar rate.

Figure 2F:
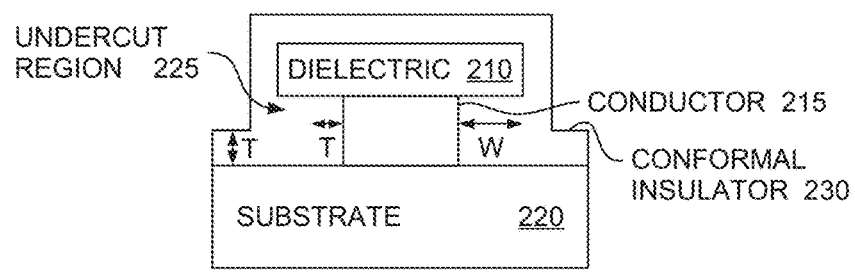

FIG. 2F illustrates filling the undercut regions 225 with the conformal insulator 230. As shown, the conformal insulator 230 has a thickness (T) on the substrate 220 which may be the same thickness deposited on the dielectric 210. In this embodiment, the deposition process is controlled such that the thickness (T) is substantially equal to one half of the width (W) of the undercut region 225. Stated differently, because the insulator 230 is grown conformally on all the surfaces of the undercut region 225, only a thickness (T) that is one half of the width (W) of the insulator 230 needs to be deposited in order to fill the undercut regions 225. In one embodiment, "substantially equal" means the conformal deposition process may deposit the insulator 230 with a thickness (T) that is up to 5% or 10% greater than one half of the width (W) to ensure the undercut region 225 is filled.

Although FIG. 2F illustrates that the undercut regions 225 are completely filled by the insulator 230, in some embodiments, there may be some gaps between the surfaces of the undercut region 225 and the conformal insulator 230. Nonetheless, using a conformal process to deposit the insulator 230 will have much smaller gaps than using a non-conformal deposition process such as plasma-enhanced chemical vapor deposition (PECVD) or evaporation. These non-conformal deposition processes may result in large areas of the bottom surface 235 and the side surfaces 240 not being contacted by the insulator 230 when deposited.

Figure 2G:
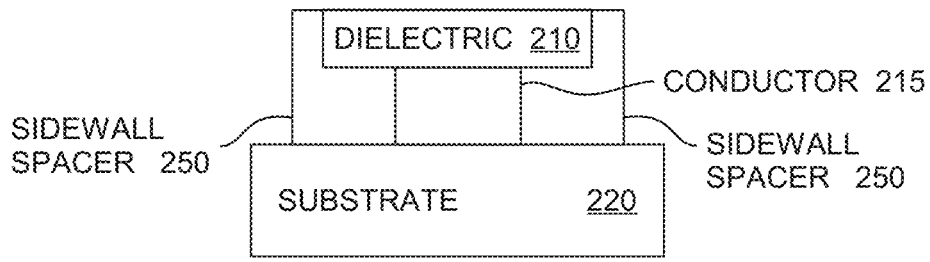

FIG. 2G illustrates etching a portion of the conformal insulator to form a sidewall spacer 250. In one embodiment, the conformal insulator is etched using a RIE process that is controlled to remove enough of the insulator such that the substrate 220 is exposed. For example, the RIE process can be controlled to remove a thickness (T) of the conformal insulator by controlling the timing of the etching process, power of the etching process, the pressure of the etching process, the rate the gas etchant is introduced into the chamber, and the like. Unlike when forming the undercut region, here the etching process may be anisotropic.

In addition to removing the conformal insulator from portions of the top surface of the substrate 220, the etching process is controlled to remove the conformal insulator from the top surface of the dielectric 210. For example, the RIE process performed in FIG. 2G can remove the material added in FIGS. 2D-2E on top of the dielectric layer 210. Thus, in one embodiment, the RIE process can be performed across the entire wafer or substrate without using any photoresist or other masking layer. To form an electrical connection to the conductor 215, in later processing steps vias can be formed through the dielectric layer 210 in which metal is deposited to connect the conductor 215 to metal layers disposed above the dielectric layer 210.

Figure 2H:
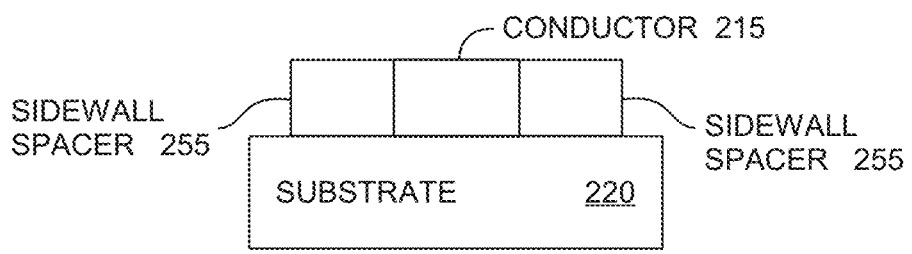

Although the sidewall spacers 250 shown in FIG. 2G can be used in, for example, a FET, additional etching steps can be performed to further shape the sidewall spacers as shown in FIG. 2H. There, an additional etch is performed to remove the dielectric layer 210 and a top portion of the conformal insulator to form sidewall spacers 255. Thus, the sidewall spacers 255 have a height that is equal to the height of the conductor 215 (i.e., the vertical structure abutting the sidewall spacers 255). Moreover, although the sidewall spacers 255 are illustrated with an idealized rectangular or square shape, when fabricated, the spacers 255 may include sloped surfaces as shown by the spacers 105 in FIG. 1.

As shown in FIG. 2H, the height of the sidewall spacers 255 is set by the height (or thickness) of the conductor 215. Thus, while the width of the undercut region sets, at least in part, the width of the resulting sidewall spacer 255, the height of the spacer 255 can be set by the height of the conductor 215. In one embodiment, the width of the sidewall spacer 255 may range from 4 to 200 nm and the height of the spacer 255 may range from 5 to 100 nm.

In one embodiment, the same RIE process used to form the sidewall spacers 250 in FIG. 2G can be continued to form the structure shown in FIG. 2H. That is, instead of stopping the RIE process, this process can continue until the dielectric layer 210 is removed and the top surface of the conductor 215 is exposed. In one embodiment, the RIE process may be selective such that the material of the dielectric layer 210 and the sidewall spacers 250 are removed but not the material of the conductor 215.

Figure 3A:
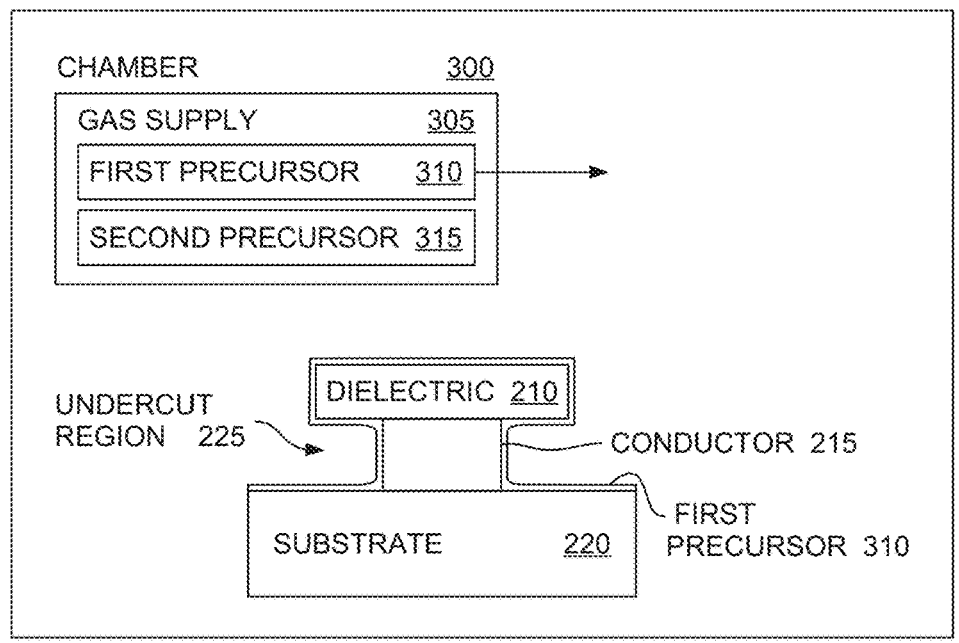
FIGS. 3A and 3B illustrate using atomic layer deposition to form sidewall spacers, according to one embodiment described herein.
Figure 3B:
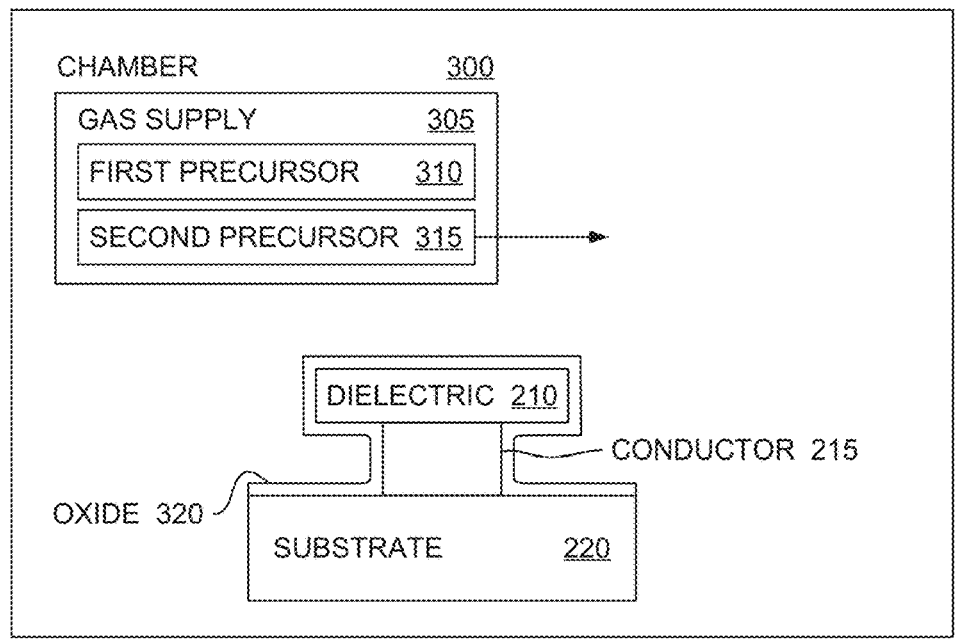

FIGS. 3A and 3B illustrate using ALD to form sidewall spacers, according to one embodiment described herein. FIG. 3A illustrates a vacuum chamber 300 that includes a gas supply 305 which can output a first precursor 310 and a second precursor 315 using pulses to form the conformal insulator 230 illustrated in FIGS. 2D-2F. Although two precursors are shown, in some embodiments, more than two precursors can be used to form the conformal insulator.

The particular precursors vary depending on the desired insulator to be deposited. As an example, to deposit a conformal layer of aluminum oxide, the first precursor 310 may be trimethyaluminum (TMA) while the second precursor 315 is water vapor ($H_2O$). The precursors for silicon dioxide, hafnium oxide, and titanium oxide will be different. Nonetheless, the techniques described herein can be used to form any of these oxides conformally on the structure shown in FIG. 3A.

In one embodiment, when performing ALD, the gas supply 305 outputs only one of the precursors at a time. In FIG. 3A, the gas supply 305 outputs the first precursor 310 into the inner portion of the chamber 300. As such, the first precursor 310 is diffused in the low pressure and is conformally deposited onto the exposed surfaces of the substrate 220, the conductor 210, and the dielectric layer 210.

FIG. 3B illustrates the state of the chamber 300 during a second pulse where instead of outputting the first precursor 310, the gas supply 305 outputs the second precursor 315 into the inner portion of the chamber. When deposited onto the first precursor 310, the second precursor 315 reacts with the first precursor 310 to form an oxide 320. For example, if the first precursor 310 is TMA and the second precursor 315 is water vapor, when the gas supply 305 outputs the water vapor, the water vapor reacts with the TMA already deposited on the surface of the structure to form aluminum oxide on the surface. That is, the already deposited first precursor 310 (e.g., TMA) reacts with the second precursor 315 (e.g., water vapor) to form the oxide 320. In one embodiment, the first precursor 310 coats all of the surfaces of the undercut region 225 with a thin layer less than 0.2 nanometers The process then repeats to increase the thickness of the oxide 320. That is, in a subsequent pulse, the gas supply 305 stops outputting the second precursor 315 and again outputs the first precursor 310 which creates another thin layer on the oxide 320. In the next pulse, the second precursor 315 is again outputted which reacts with the deposited first precursor 310 to increase the thickness of the oxide 320. The process can repeat to deposit the desired thickness of oxide 320. In this case, the process is repeated until the undercut region 225 is filled. Because only one of the precursors is outputted at a time, the reaction between the precursors occurs only on the surfaces of the dielectric 210, conductor 215, and the substrate 220 rather than in the environment surrounding the structure which results in the conformal film as shown.

Figure 4:
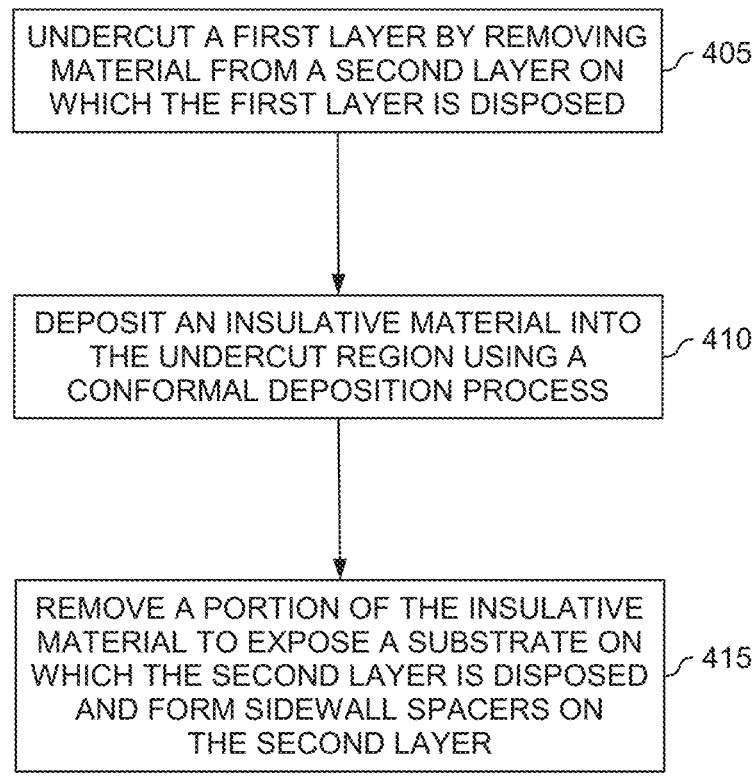
FIG. 4 is a flowchart for forming sidewall spacers, according to one embodiment described herein.

FIG. 4 is a flowchart of a method 400 for forming sidewall spacers, according to one embodiment described herein. The method 400 begins at block 405 where an etch is performed to undercut a first layer by removing material from a second layer on which the first layer is disposed. In one embodiment, the first layer is a dielectric layer that has previously been disposed on the second layer—e.g., a conductor such as an electrode. In one embodiment, the etch is an isotropic etch which removes the material of the second layer in both a first direction and a second direction that is perpendicular to the first direction. In one embodiment, the isotropic etch is a RIE etch that uses a chemical etchant that selectively etches the material of the second layer but not the first layer. As a result, a portion of the first layer hangs over the material of the second layer to form the undercut region. One example of the undercut region is shown in FIG. 2C where the first layer is the dielectric 210 and the second layer is the conductor 215.

At block 410, a conformal deposition process deposit an insulative material into the undercut region. In one embodiment, the conformal deposition results in the insulative material contacting all the surfaces defining the undercut region—e.g., the bottom surface of the first layer and the side surface of the second layer which is perpendicular to the bottom surface of the first layer. In one embodiment, the conformal deposition process is ALD, but any process that can conformally coat the surfaces of the undercut region with a suitable material for a sidewall spacer can be used.

At block 415, a portion of the insulative material is removed to expose a substrate on which the second layer is disposed and form sidewall spacers in the second layer. For example, when depositing the insulative material at block 410, the insulative material may have been deposited on all exposed surfaces of the wafer. At block 415, the insulative material is removed from portions of the wafer where the insulative material is not desired. However, the insulative material in the undercut region remains to form the sidewall spacers.

In one embodiment, the sidewall spacers have a height that is greater than the height of the second layer as shown in, for example, FIG. 2G where the sidewall spacers 250 extend above the conductor 215. However, during block 415, the dielectric material in the first layer may also be etched until a top surface of the material in the second layer is disposed as shown in, for example, FIG. 2H. In this embodiment, the height of the sidewall spacers is the same height as the second layer. As described above, a RIE process may be used to etch the insulative material at block 415.

Figure 5:
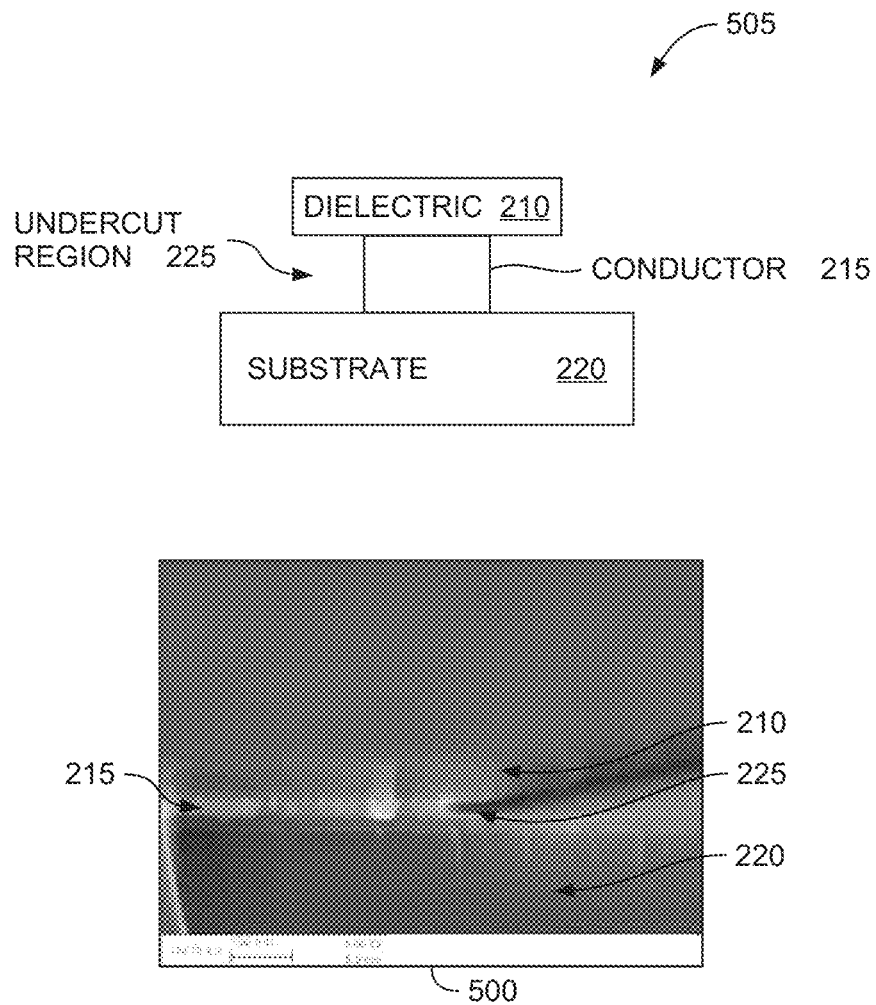
FIG. 5 illustrates a scanning electron microscope (SEM) image of an undercut region, according to one embodiment described herein.

FIG. 5 illustrates a SEM image 500 of an undercut region 225, according to one embodiment described herein. The SEM image 500 illustrates a cross-section side view of a fabricated structure which corresponds to the idealized structure 505. The structure 505 includes the dielectric layer 210 in a first layer overhanging the conductor 215 in a second layer to form the undercut region 225. Both the dielectric 210 and the conductor 215 are disposed on the substrate 220. These corresponding structures are labeled in the SEM image 500.

Figure 6:
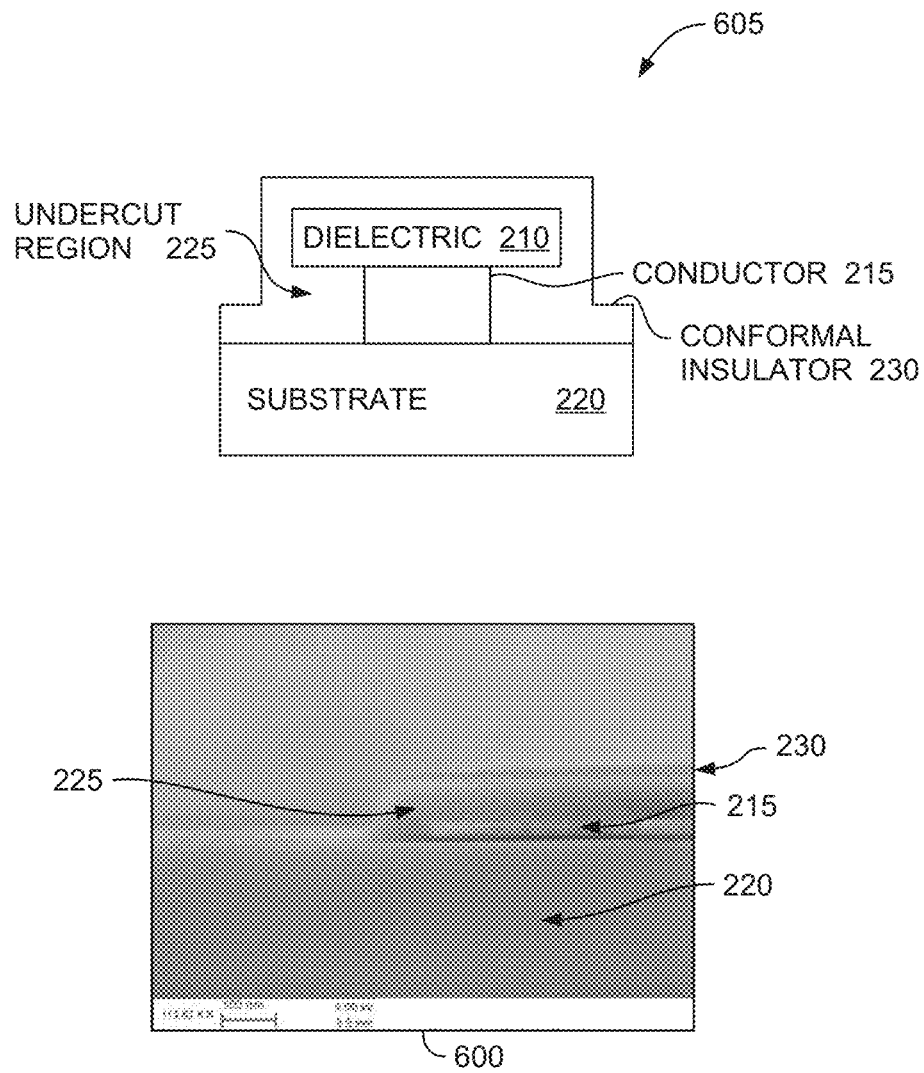
FIG. 6 illustrates a SEM image of filling an undercut region, according to one embodiment described herein.

FIG. 6 illustrates a SEM image 600 of filling an undercut region 225, according to one embodiment described herein. The SEM image 600 illustrates a side view of a fabricated structure which corresponds to the idealized structure 605. The structure 605 includes the dielectric layer 210 in a first layer overhanging the conductor 215 in a second layer. In this embodiment, the undercut region 225 is filled with the conformal insulator 230. These corresponding structures are labeled in the SEM image 600.

Figure 7:
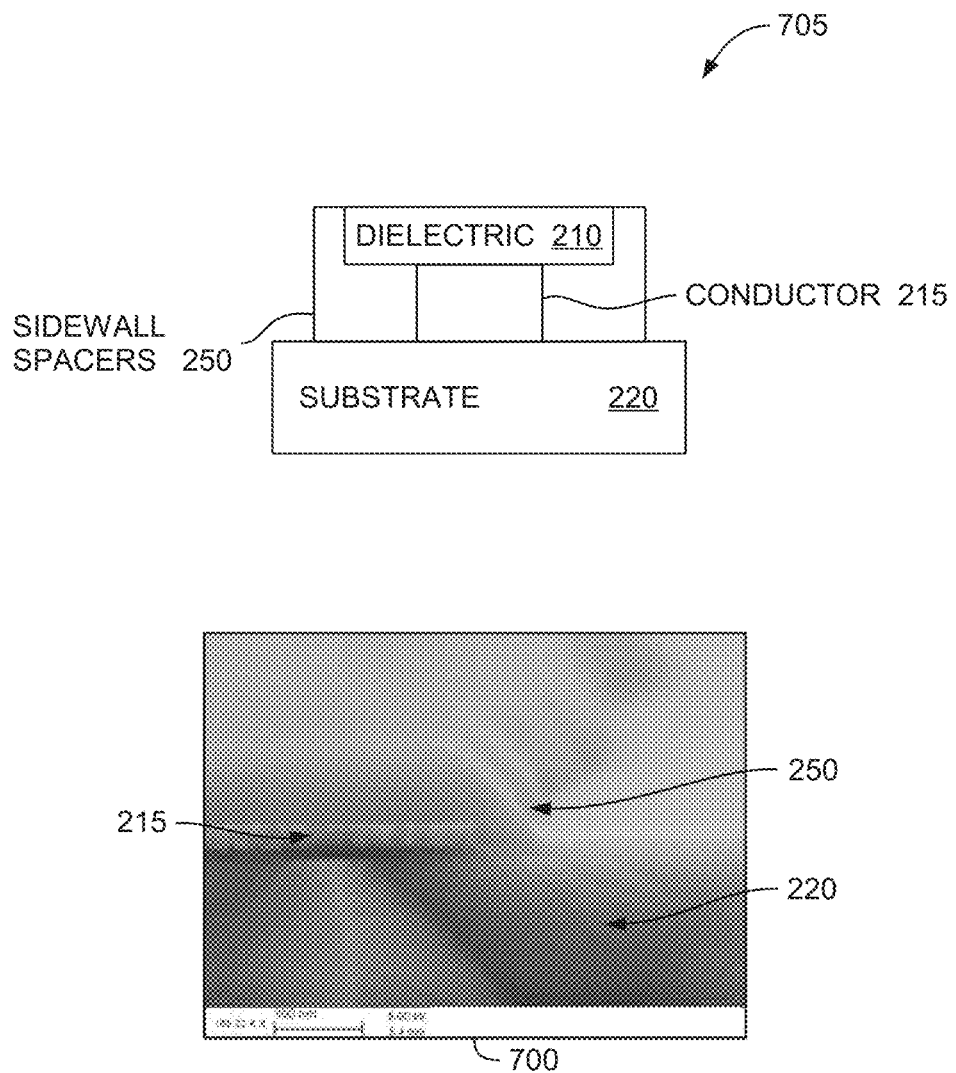
FIG. 7 illustrates a SEM image of a sidewall spacer, according to one embodiment described herein.

FIG. 7 illustrates a SEM image 700 of a sidewall spacer, according to one embodiment described herein. The SEM image 700 illustrates a side view of a fabricated structure which corresponds to the idealized structure 705. The structure 705 includes the dielectric layer 210 in a first layer overhanging the conductor 215 in a second layer. Further, the insulative material is etched to form sidewall spacers 250 on the substrate 220. A portion of the sidewall spacers 250 include the undercut region. These corresponding structures are labeled in the SEM image 700. As can be seen in the SEM image 700, the side of the sidewall spacer 250 has a slope that is not shown in the idealized structure 705.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

It is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

While the foregoing is directed to embodiments of the present invention, other and further embodiments of the invention may be devised without departing from the basic scope thereof, and the scope thereof is determined by the claims that follow.

What is claimed is:

1. A method, comprising:
    providing a first layer directly contacting a first side of a second layer and a substrate directly contacting a second side of the second layer, wherein the first side is opposite the second side, and wherein a material in the first layer is different than a material in the second layer;
    selectively etching the material of the second layer to form an undercut region in the second layer, wherein the material of the first layer and the substrate are not removed when etching the second layer;
    filling the undercut region with an insulative material using a conformal deposition process;
    etching the insulative material thereby exposing a top portion of the first layer and a portion of the substrate to form at least one sidewall spacer in the second layer, wherein the at least one sidewall spacer includes the undercut region;
    after exposing the top portion of the first layer and the portion of the substrate, forming at least one via extending through the first layer; and
    depositing a conductive material into the via, wherein the conductive material electrically connects the second layer to a conductive layer disposed above the first layer.

2. The method of claim 1, wherein the material of the first layer comprises an insulator and a material of the second layer comprises a conductor.

3. The method of claim 1, wherein the conformal deposition process is an atomic layer deposition (ALD) process comprising a plurality of precursors used to form the insulative material.

4. The method of claim 1, wherein selectively etching the material of the second layer comprises:
    performing an isotropic etch on the material of the second layer, wherein the isotropic etch etches the material of the second layer in a first direction and in a second direction perpendicular to the first direction.

5. The method of claim 4, wherein the isotropic etch is performed using a reactive ion etch (RIE).

6. The method of claim 1, wherein filling the undercut region with the insulative material comprises:
    controlling the conformal deposition process such that a thickness of the insulative material is substantially equal to one half of a width of the undercut region.

7. The method of claim 1, wherein etching the insulative material to form the at least one sidewall spacer comprises:
    performing RIE to remove at least a portion of the insulative material.

8. The method of claim 7, wherein, after performing RIE, a height of the least one sidewall spacer is equal to a height of the second layer.

9. A method, comprising:
    providing a dielectric layer directly contacting a first side of a conductor and a substrate directly contacting a second side of the conductor, wherein the first side is opposite the second side;
    selectively etching the conductor to form an undercut region, wherein the material of the dielectric layer and the substrate are not removed when etching the conductor;
    filling the undercut region with a first material using a conformal deposition process;
    etching the first material thereby exposing a top portion of the dielectric layer and a portion of the substrate to form at least one sidewall spacer contacting the conductor, wherein the at least one sidewall spacer includes the undercut region;
    after exposing the top portion of the dielectric layer and the portion of the substrate, forming at least one via extending through the dielectric layer; and
    depositing a conductive material into the via, wherein the conductive material electrically connects the conductor to a conductive layer disposed above the first layer.

10. The method of claim 9, wherein the conformal deposition process is an ALD process comprising a plurality of precursors used to form the first material.

11. The method of claim 10, wherein the first material comprises an oxide.

12. The method of claim 9, wherein selectively etching the conductor comprises:
    performing an isotropic etch on the conductor, wherein the isotropic etch etches the conductor in a first direction and in a second direction perpendicular to the first direction.

13. The method of claim 12, wherein the isotropic etch is performed using a RIE.

14. The method of claim 9, wherein filling the undercut region with the first material comprises:
    controlling the conformal deposition process such that a thickness of the first material is substantially equal to one half of a width of the undercut region.

15. The method of claim 9, wherein etching the first material to form the at least one sidewall spacer comprises:
    performing a RIE to remove at least a portion of the first material.

16. The method of claim 15, wherein, after performing the RIE, a height of the least one sidewall spacer is equal to a height of the conductor.

17. A method, comprising:
    providing a first layer directly contacting a first side of a second layer and a substrate directly contacting a second side of the second layer, wherein the first side is opposite the second side, and wherein a material in the first layer is different than a material in the second layer;
    selectively etching the material of the second layer, but not the material of the first layer and the substrate, wherein the material of the first layer and the substrate are not removed when etching the second layer, to form respective undercut regions on third and fourth sides of the material in the second layer;
    filling the respective undercut regions with an oxide material using a conformal deposition process;
    etching the oxide material thereby exposing a top portion of the first layer and a portions of the substrate to form two sidewall spacers in the second layer, wherein the two sidewall spacers include the respective undercut regions;

after exposing the top portion of the first layer and the portions of the substrate, forming at least one via extending through the first layer; and depositing a conductive material into the via, wherein the conductive material electrically connects the second layer to a conductive layer disposed above the first layer.

18. The method of claim 17, wherein the two sidewall spacers directly contact the third and fourth sides of the material in the second layer.

* * * * *